United States Patent
Shealy et al.

[19]

[11] Patent Number: 6,028,483
[45] Date of Patent: Feb. 22, 2000

[54] UNIVERSAL FIXTURE/PACKAGE FOR SPATIAL-POWER-COMBINED AMPLIFIER

[75] Inventors: Jeffrey B. Shealy, Germantown, Md.; David B. Rensch, Thousand Oaks, Calif.; Angelos Alexanian, Boston, Mass.; Robert York, Santa Barbara, Calif.

[73] Assignees: Hughes Electronics Corporation, El Segundo; University of California, Santa Barbara, Oakland, both of Calif.

[21] Appl. No.: 09/073,705

[22] Filed: May 6, 1998

[51] Int. Cl.[7] ................................................ H03F 3/60
[52] U.S. Cl. ........................... 330/286; 330/295; 333/248
[58] Field of Search .................................. 330/286, 295, 330/65, 66, 67, 68; 333/248, 250, 256, 257; 257/731; 11/732

[56] References Cited

U.S. PATENT DOCUMENTS

| | | | |
|---|---|---|---|
| 4,291,278 | 9/1981 | Quine | 330/286 |
| 4,588,962 | 5/1986 | Saito et al. | 330/286 |
| 5,032,798 | 7/1991 | Myer | 330/295 |
| 5,394,125 | 2/1995 | Bartley et al. | 330/286 |
| 5,396,203 | 3/1995 | Hant | 333/248 |
| 5,736,908 | 4/1998 | Alexanian et al. | 330/286 |
| 5,765,835 | 6/1998 | Johnson | 333/248 |
| 5,920,240 | 7/1999 | Alexanian et al. | |

*Primary Examiner*—Robert Pascal
*Assistant Examiner*—Khanh Van Nguyen
*Attorney, Agent, or Firm*—V. D. Duraiswamy; M. W. Sales

[57] ABSTRACT

A combined test fixture and spatial-power-combined amplifier includes a base, a first waveguide mounting flange engaged to said base, a second waveguide mounting flange engaged to said base, a waveguide input fixed to said first flange, a waveguide output fixed to said second flange, an amplifier array disposed between said first flange and second flange, said array comprising a plurality of semiconductors for amplifying a signal, and a spacer for spacing apart said semiconductors. A plurality of amplifier cards constitute the array, with the cards being disposed in various arrangements which include a linearly stacked arrangement and radially stacked arrangement. The first and second waveguide mounting flanges are constructed to slide along the base to enable the amplifier array to be easily changed.

28 Claims, 5 Drawing Sheets

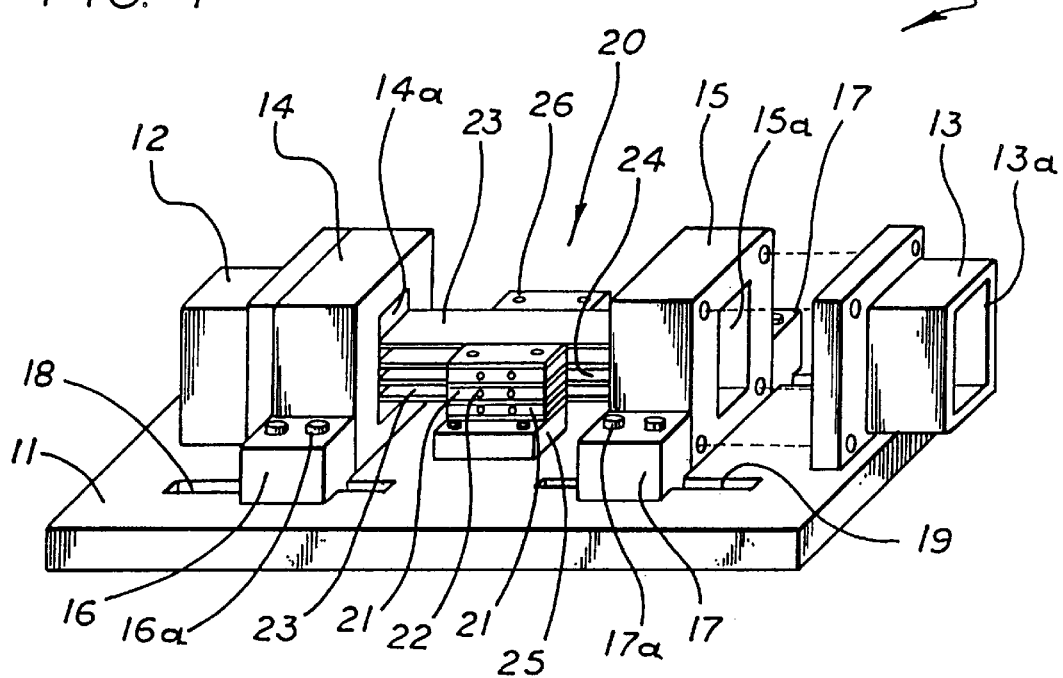
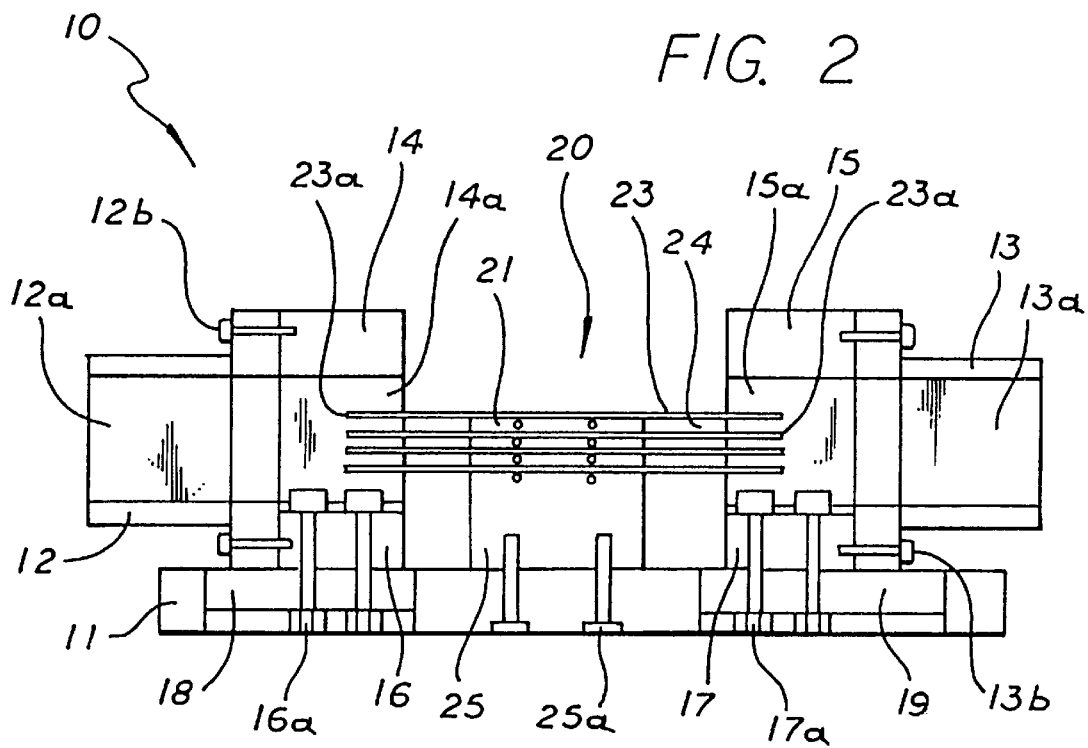

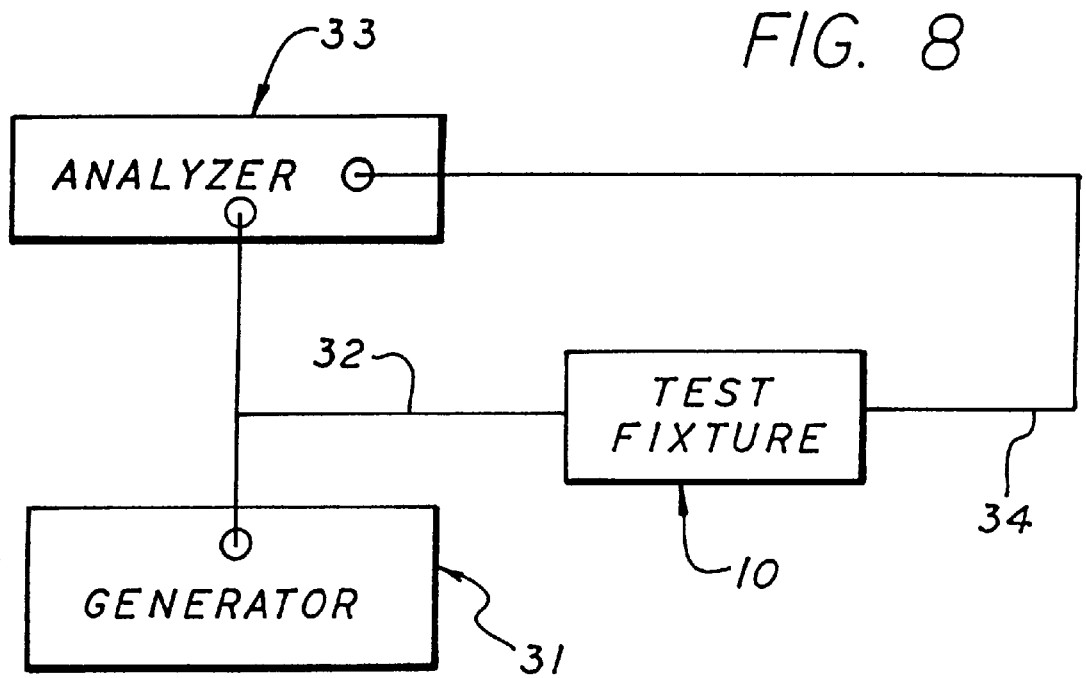
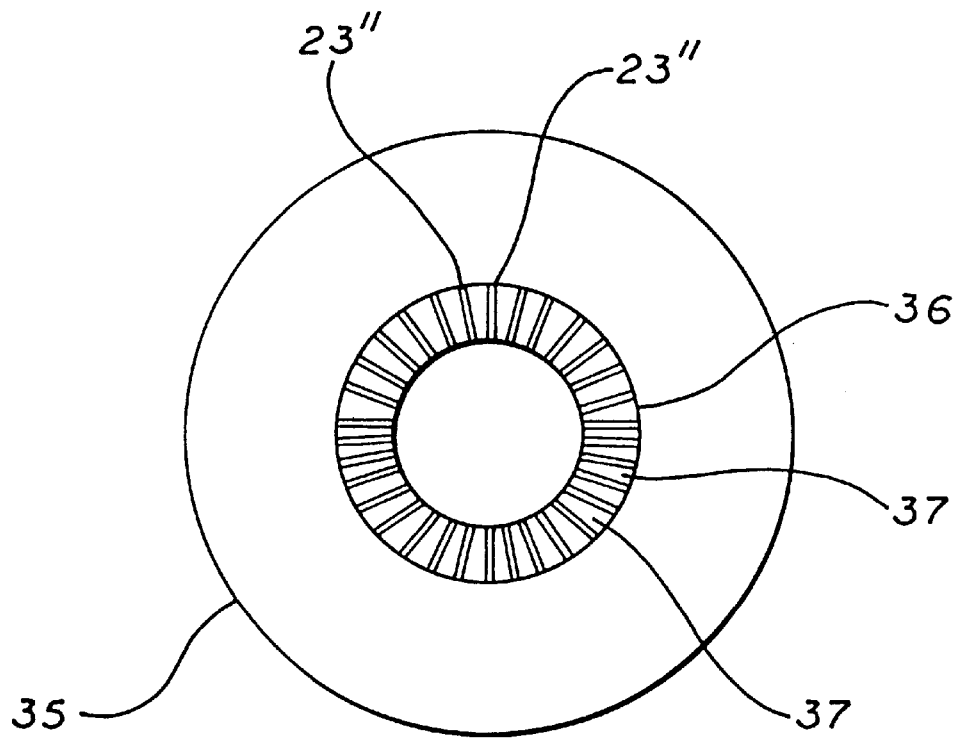

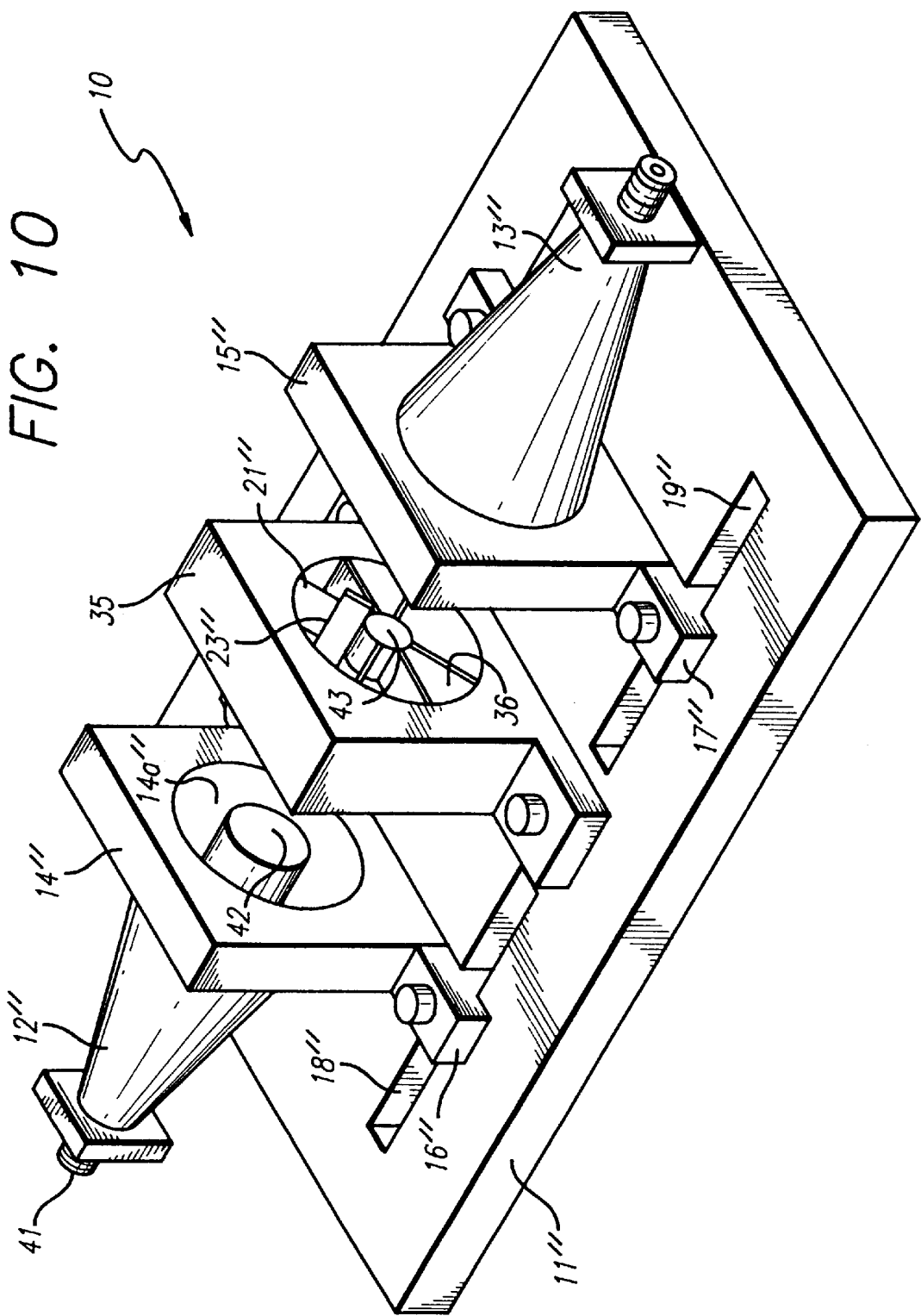

UNIVERSAL FIXTURE/PACKAGE FOR SPATIAL-POWER-COMBINED AMPLIFIER

This invention was made with Government support under Contract No. N66001-96-C-8625 awarded by the Department of the Navy. The Government has certain rights in this invention.

BACKGROUND OF THE INVENTION

1. Field of the Invention

The present invention generally relates to solid state amplifiers and fixtures for testing solid state devices and, more particularly, to spatial-power-combined amplifiers which use multiple cards or arrays of solid-state amplifiers and radiating antennas and, at the same time, incorporate the ability to act as a flexible test fixture.

2. Description of Related Art

The use of solid-state power combining amplifier techniques has continued to be of interest because of considerations pertaining to size, weight, reliability and manufacturing cost. In the context of microwave/millimeter-wave systems, for example, power combining amplifier techniques are of significance since those systems potentially provide larger output power than a single solid-state amplifier. Further, those types of systems are readily adaptable to changes in the physical and geographical environment. And, the interest in microwave/millimeter-wave systems spans a wide range of applications, including military applications such as radar, missile seekers, satellite links, and consumer applications such as base stations for wireless communications.

In an application where a large number of microwave/millimeter-wave amplifiers must be combined, conventional power combining amplifier techniques have performed at lower than optimal levels. One conventional technique has been referred to as the corporate combiner. Multiple solid-state amplifiers are successively combined using two-way adders. But as the number of amplifiers becomes large, the power combining efficiency can become too low. Other contributing factors to decreased efficiency are resistive, radiative, and dielectric losses.

Another conventional technique is the chain combiner. An input waveguide feeds all of the amplifier inputs, and all of the amplifier outputs feed an output waveguide. Cross-guide couplers with adjustable coupling ratios at each amplifier stage are used to ensure an equal power distribution to the amplifiers on the input waveguide.

In an effort to address some of the performance concerns in conventional techniques, new power combining methods using spatial or quasi-optical techniques have been developed. Those techniques are an extension of classical antenna array systems. The techniques generally incorporate a planar array of cells, each having a conventional planar antenna structure. The cells are usually a half-wavelength or larger in size and the array is placed in a radiating structure. Most often, the array is positioned transverse to the propagating beam. Thereby, the array couples energy from the multiple devices in free-space or in a metallic waveguide. Among other things, what is sought is a reduction in diffraction losses and more power in a smaller volume.

Yet, in the past, optimization of spatial-power-combined amplifiers using metallic waveguides has been limited for various reasons. For example, the maximum achievable power is derived from the efficiency of the amplifier as a whole rather than the power per device. Therefore, power can be increased by increasing the device density or overall size of the amplifier array. But as the density of the devices increases or the size of the array increases, the need to remove heat increases. As can be appreciated, the increased need to remove heat places a limitation on the maximum density or size of array achievable. Additionally, the individual amplifiers must be supplied with a bias. Preferably, the bias is supplied in such a fashion that the failure of one device does not affect all of the others. But, again, as the device density and/or array size increases, the supplying of a bias becomes more problematic. When spatial power combining techniques have incorporated multiple arrays to achieve higher power amplification with higher gain and efficiency, the above issues have become greater, as well as usability issues arising. Therefore, with the possibility of less than optimal performance, there is a need to efficiently and quickly evaluate potential amplifier card configurations in a spatial-power-combined amplifier.

In an effort to meet the objectives of evaluating and optimizing solid state devices and monolithic microwave integrated circuits (MMICs), Wiltron Co. has produced a universal test fixture for testing a single substrate of either microstrip or coplanar waveguide circuits. A fixed connector block allows a jaw to clamp one end of the substrate. A sliding connector block can slide into connection with another end of the substrate. A connector pin from the jaw connects with a substrate conductor. With the ability to hold only a single substrate, it can be appreciated that efficiency of use of such device is less than if multiple substrates could be held for evaluation at any given time.

As can be seen, there is a need for improved spatial power combining apparatus and, in particular, a spatial-power-combined amplifier in a metallic waveguide that provides for the use of multiple amplifier device arrays which remain easily changeable from one array to another to thereby increase the efficiency in use and number of useful environments. At the same time, there is a need to have the spatial-power-combined amplifier serve as a fixture to test amplifier devices found in the arrays.

SUMMARY OF THE INVENTION

The present invention is directed towards an improved universal fixture for testing spatial power combined amplifiers in a metallic waveguide, as well as an improved amplifier itself. More particularly, the present invention satisfies the need of providing an apparatus that can utilize multiple cards or arrays of solid-state amplifiers such that the cards can be maintained in a spaced apart relationship. The cards remain easily removable so that other cards having different amplification devices or different heat removal structures may be readily used in the apparatus. At the same time, present invention satisfies the need of having such amplification apparatus function as a fixture to test the amplification devices on a card, as well as the individual card as a whole.

The improved apparatus of the present invention, according to one embodiment, includes a base with a pair of mounting flanges slidably engaged to the base. A plurality of cards having solid-state amplifiers thereon are spaced apart from each other and detachably disposed between the mounting flanges. A plurality of spacers are disposed among the cards and the spacers provide bias access to and heat removal from the cards.

These and other features, aspects and advantages of the present invention will become better understood with reference to the following drawings, description, and claims.

BRIEF DESCRIPTION OF THE DRAWINGS

FIG. 1 is a perspective view of a universal fixture/package for spatial-power-combined amplifier according to an embodiment of the present invention wherein said invention is being used as an amplifier.

FIG. 2 is a side view of the present invention shown in FIG. 1.

FIG. 8 is a diagram showing a system including a universal fixture/package for spatial-power-combined amplifier according to an embodiment of the present invention wherein said invention is being used as a test fixture.

FIG. 9 is plan, cross-sectional view of another embodiment of the present invention wherein a plurality of cards are disposed in a radial configuration for a universal fixture/package for spatial-power-combined amplifier.

FIG. 10 is a perspective view of a universal fixture/package for spatial-power-combined amplifier according to another embodiment of the present invention wherein a plurality of cards are disposed in a radial configuration.

DESCRIPTION OF THE PREFERRED EMBODIMENTS

Figure 3:
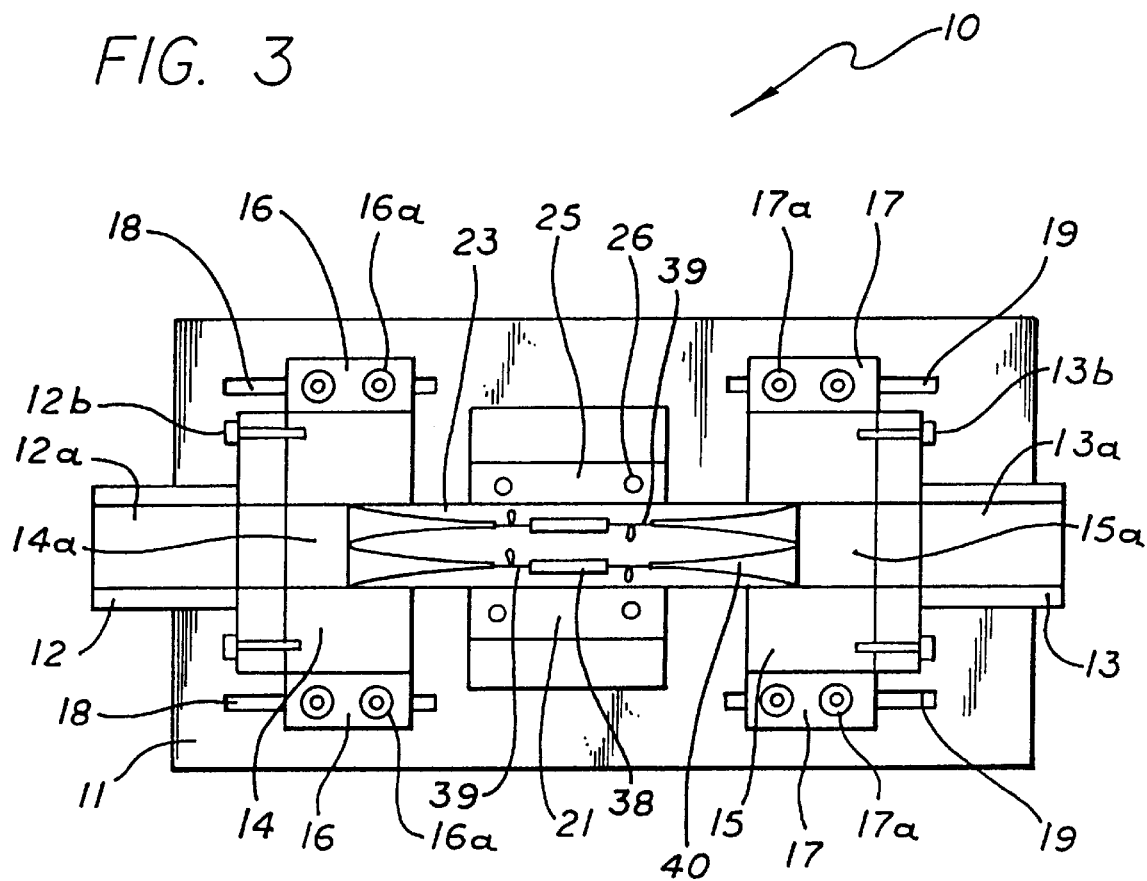
FIG. 3 is a top view of the present invention shown in FIG. 1.

A universal fixture/package for spatial-power-combined amplifier in a metallic waveguide 10 is provided for use as an amplifier, as shown in FIG. 1, or as a fixture to test semiconductor substrates, as shown in FIG. 8. In the context of an amplifier, and according to one embodiment of the present invention, FIG. 1 shows the amplifier/test fixture 10 which can receive an input signal or electrical field through a waveguide input 12. With the input signal in waveguide mode, the signal then transitions from waveguide mode to slotline mode through antennae 40 contained on electrically insulating substrates or cards 23 for the embodiment shown in FIG. 3. Once the received signal is coupled to the slotline mode, it is then transitioned into a coplanar waveguide (CPW) or a microstrip mode by a slotline-to-transmission line transition. CPW or microstrip transmission lines 39 are used to provide the proper impedance to amplifiers 38 on the individual cards 23. In combination, the multiple substrates or cards 23 provide an amplifier array 20. The amplifier array 20 amplifies the input signal. The cards 23 can be readily removed and replaced with other cards 23 that might, for example, use different card amplifiers. Irrespective of the particular card 23 configuration, after the signal has been amplified, the amplifier array 20 transitions the signal back to its original mode, which in this embodiment is waveguide. Thereafter, the amplified or power combined signal is outputted through the waveguide output 13.

Figure 7:
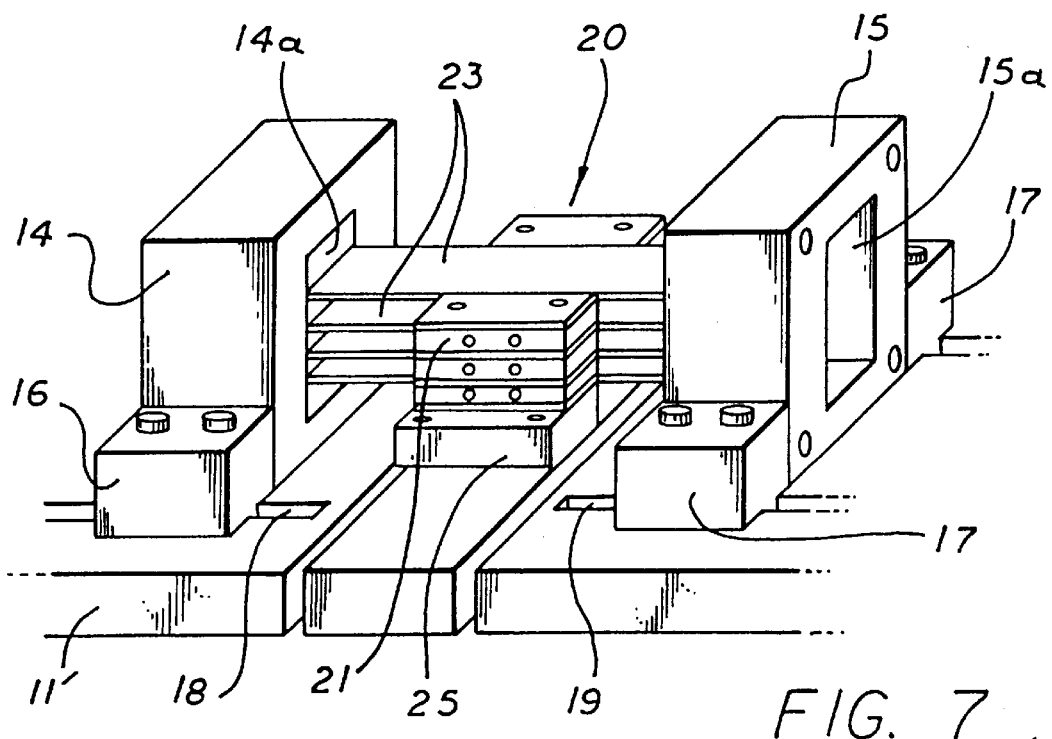
FIG. 7 is a perspective view of a universal fixture/package for spatial-power-combined amplifier according to another embodiment of the present invention which incorporates a multiple component base.

Referring to FIG. 1, the amplifier/test fixture 10 is constructed with a base 11 to support the remaining components and also allow the entire fixture 10 to be easily transported for use in varying locations. While the base 11 can be constructed of a variety of materials which can support the entire fixture 10, according to this embodiment of the present invention, the base 11 is constructed from copper. Although the base 11, as shown in FIG. 1, is a single component, it is contemplated that the base 11 can be constructed in multiple components. For example, in reference to FIG. 7, the base 11' can comprise three components, with one component being disposed and dimensioned according to the position and size of the amplifier array 20. With such a construction, the cards 23 can be more readily evaluated. For example, if the transition mode needs to be changed, the existing cards 23 (containing one type of transition mode), spacers 21, and heat sink 25 can be easily removed by sliding adjustable flange portions 16,17 away from the array 20 and removing the component of the base 11' which is disposed directly adjacent or underneath such items. After removing the spacers 21 and the heat sink 25, the existing cards 23 can then be replaced with the new cards 23 containing a different transition mode.

Figure 4:
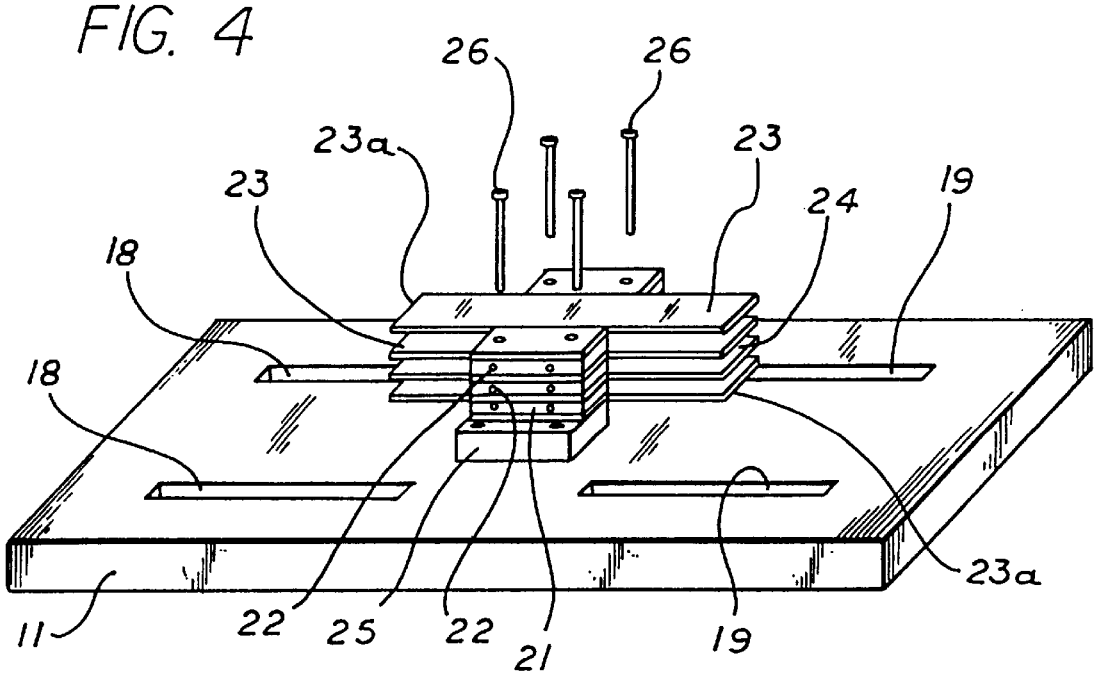
FIG. 4 is a perspective view of an amplifier array according to an embodiment of the present invention shown in FIG. 1.

Whether a single component or in multiple components, the base 11 is configured to provide a pair of substantially parallel slots 18 in one half of the base 11 and a similar pair of slots 19 in the other half of the base 11, as best shown in FIG. 4. The slots 18, 19 can vary in length, depending upon the length over which it is desired to enable four adjustable flange portions 16, 17 to move along a longitudinal axis or length of the base 11. The slots 18, 19 provide a means for a pair of adjustable flange portions 16 and a pair of similarly constructed and configured adjustable flange portions 17 to move along the slots 18, 19. In this embodiment of the invention, the flange portions 16 are slidably engaged to the base 11 along the slots 18, while the flange portions 17 are similarly engaged along the slots 19. As shown in FIG. 1, each of the flange portions 16 are engaged to the base 11 by a pair of bolts 16a that extend within the portions 16 and through the slots 18. Thereby, the bolts 16a slide within and along the slots 18. Likewise, each of the flange portions 17 are slidably engaged to the base 11 by a pair of bolts 17a which can slide within and along the slots 19.

Each of the flange portions 16 constitute a portion of a mounting flange 14 while each of the flange portions 17 constitute a portion of a mounting flange 15. Thereby, the mounting flanges 14,15 can be slidably moved along the base 11 when the bolts 16a, 17a are loosened to enable the flange portions 16, 17 to move. In this embodiment of the invention, the flanges 14,15 are similarly constructed and configured. Preferably, the flanges 14,15, together with the flange portions 16,17, are constructed of copper or another similar metal in order to minimize RF losses.

In again referring to FIG. 1, the mounting flanges 14,15 are configured to provide respective apertures 14a, 15a which extend through the flanges 14, 15 and are rectangular in shape for this embodiment of the invention. More specifically, the apertures 14a, 15a are dimensioned to permit the low loss propagation of the fundamental waveguide mode for a particular frequency band. Such dimensions are provided by the use of commercially manufactured waveguides which are produced in so-called standard sizes for various bandwidths. Also, the apertures 14a, 15a releasably engage the end portions 23a of the cards 23, which is best depicted in FIG. 2. According to an embodiment of the present invention, the cards 23 are generally rectangular in shape. Thereby, and although the extent can vary, the end portions 23a can extend into the apertures 14a, 15a from about several millimeters (e.g., 4 mm) to tens of millimeters (e.g., 25 mm) in order to maximize the useful frequency bandwidth of the amplifier.

Figure 6:
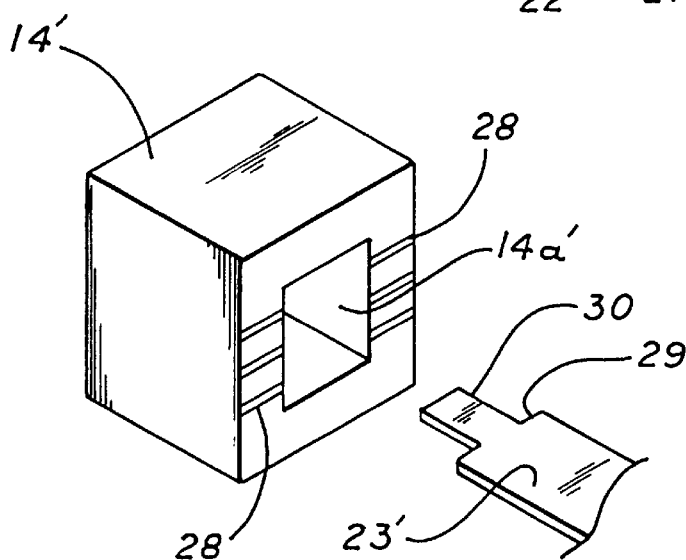
FIG. 6 is a perspective view of a mounting flange and a card for a universal fixture/package for spatial-power-combined amplifier according to another embodiment of the present invention.

According to another embodiment of the present invention, a card 23' can have different end configurations, as shown for example in FIG. 6, even though the remainder of the card 23' remains generally rectangular in shape. The card 23' has at its end portion two recessed portions 29 with an extended portion 30 therebetween. With such an embodiment, a mounting flange 14' is configured to provide a plurality of grooves 28 around an aperture 14a' and disposed on a surface which is opposite the cards '23 to be engaged. The grooves 28 are dimensioned to receive the recessed portions 29 of each card 23'. In some applications, the recessed portion 29 can be sized to fit into the flange 14' without requiring the grooves 28. In either event, the resulting arrangement allows the cards 23' to be easily removed and changed. At the same time, that arrangement minimizes errant movement of the cards 23'.

In this embodiment of the present invention, the waveguide input 12 is detachably fixed to the mounting flange 14 on a surface opposite of that surface of the flange 14 which the cards 23 interface. A plurality of bolts 12b are used to attach the waveguide input 12 to the mounting flange 14 (FIG. 2).

Consequently, different waveguide inputs 12, such as WR-90, from test equipment used in the characterization of the amplifier cards 23 can be attached and detached. Moreover, it is contemplated that the present invention can be used over a range of frequencies, namely, L-band to Ka-band. A limiting factor, however, in the frequency range applicable to the present invention is that a waveguide input 12 may become so small that the number of amplifier cards 23 that can reasonably fit into the flange 14 becomes too low to permit multiple cards.

When viewed in FIGS. 2 and 3, it can be seen that the aperture 12a of the waveguide input 12 is preferably rectangular and dimensioned to be substantially the same as the aperture 14a of the mounting flange 14. Being so configured and dimensioned, the waveguide input 12 can receive a signal and input that signal to and through the mounting flange 14 with minimal disruption. As can be appreciated by those skilled in the art, the less signal disruption, the better the amplification. And since the signal passing through the flange 14 is in a wave form, the transverse amplitude distribution of the signal within the flange 14 varies. In order to reduce the transverse variance of the electric field in the flange 14, a dielectric can be fixed along the walls within the aperture 14a. By reducing the variability of the electric field in the flange 14, the coherency of the signal in its subsequent amplified state is increased. The amount and thickness of the dielectric can vary depending upon the dielectric constant of the material. Yet, it is preferred that the dielectric constant range from about 4 to 8 and that the thickness range from about 35 mil to 90 mil but with the thickness being minimized as much as possible. Accordingly, the preferred embodiment of this invention contemplates the use of alumina (which has a dielectic constant of 4) at a thickness of about 35 mil in a WR-90 waveguide input 12 which has an approximate height of about 22 mm.

Upon the signal or electrical field passing through the mounting flange 14, the signal becomes directed over the spaced apart end portions of the cards 23, as indicated in FIGS. 2 and 3, with the combined cards 23 constituting the amplifier array 20. From the end portions of the cards 23, the signal continues across and through the amplifier array 20. Any one card or substrate 23 includes multiple semiconductor devices which are well known in the art for amplifying electrical fields. Further, and as well known in the art, the cards 23 can be constructed for transmission of an electrical field in various modes, such as slotline, coplanar waveguide, and microstrip. It can be appreciated by those in the art that the cards 23 allow the incoming electrical field or signal to transition from one mode to another. In the embodiment shown in FIG. 3, the signal transitions from waveguide mode, to slotline mode, and then to microstrip or coplanar waveguide mode. Thereafter, the signal transitions back to slotline mode and then finally back to waveguide mode. Upon making such transitions, the signal is amplified by each of the cards 23.

The general construction of amplifier cards 23 is described, for example, by Alexanian et al., Broadband Waveguide-Based Spatial Combiners, IEEE MTT-S Digest Paper TH1A-2, pg. 1139 (1997). The cards 23 are constructed with a substrate such as aluminum nitride, which has the characteristics of low loss at microwave or millimeter-wave frequencies, as well as low thermal resistance. In order to provide a coherent combination of amplified power from the totality of the cards 23, at any one time, each of the cards 23 will be constructed with the same type of transmission mode. Accordingly, each card 23 will have the same number and arrangement of semiconductor amplification devices, according to this embodiment of the present invention. Thus, the amplifier array 20 can be described as having an M×N array, with M being the number of amplification devices on any one card 23 and N being the number of cards 23 in the array 20. With a WR-90 waveguide input 12, it is preferred that the number of cards 23 varies from about 4 to 6, with 4 cards 23 being a minimum number to prevent significant losses in the signal transmission.

The amplifier array 20 is further described by multiple spatial areas 24 which are located between the cards 23. The spatial areas 24 constitute free air space between the cards 23. In this embodiment wherein the waveguide input 12 is WR-90, and each card 23 with amplification devices is about 40 mil thick, the air spaces are about 1 to 2 mm from one card 23 to the next card 23. Although FIGS. 1, 2, 4 and 8 depict the spatial areas 24 as being substantially equal in size, the present invention contemplates that the spatial areas can vary in size. As an example, in order to modulate the variability of the input electrical field, the spatial areas 24 can be varied. If the amplitude of the input electrical field is highest generally at the center area of the aperture 14a, the spatial areas 24 that are immediately adjacent such center area would preferably be of a larger size than the spatial areas 24 which are more distant from that center area. In such a fashion, the portion of the electric field having a relatively smaller amplitude would be subjected to a relatively greater number of cards 23 or amplification devices, as compared to the portion of the electric field having a relatively larger amplitude.

A plurality of spacers 21 each being about 100 mil thick, in this embodiment, assist in creating the spatial areas 24, as well as providing a means for carrying away heat. In referring to FIG. 4, it can be seen that each of the spacers 21 support a respective card 23. The spacers are disposed in a linearly, stacked arrangement such that the cards 23 consequently take on a linearly, stacked arrangement. Further, in their stacked arrangement, the cards 23 are then substantially parallel to one another along the planar surfaces of the cards 23 while separated by the spatial areas 24. With the characteristic of the cards 23 being substantially parallel, the spatial areas are generally of the same size. With such an arrangement of the cards 23 and the spatial areas 24, the field passing through the amplifier array 20 maintains more coherency before and after amplification, as compared to when the spatial areas 24 are of a random size.

Figure 5:
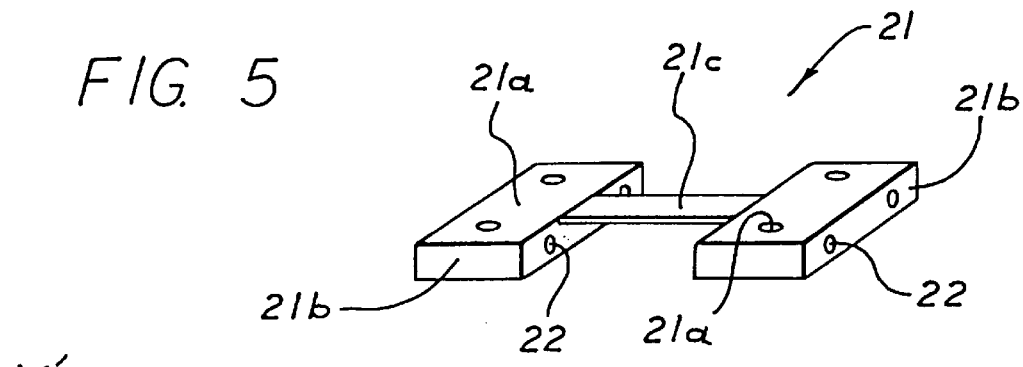
FIG. 5 is a perspective view of a spacer according to an embodiment of the present invention shown in FIG. 4.

A preferred construction of the spacer 21 is shown in FIG. 5. The spacer 21 includes a base portion 21a that is fixed to one end of a bridge portion 21c. The opposite end of the bridge portion 21c is affixed to a base portion 21b. The combination of the bridge portion 21c and the base portions 21a, b provide a recess in which a card 23 can be held by thermal conductive grease, along with machine screws. As better shown in FIG. 4, each base portions 21a, b describe a pair of access holes 22 which extend through such portions 21a, b and in a direction generally perpendicular to the direction of travel of the electrical field. With the access holes 22 having such position and orientation, bias lines can be brought on opposite sides through the holes 22 and to the cards 23, whereby resistive losses from individual buss lines to a main buss can be reduced. Those types of losses can be of particular concern for high current bias lines such as a drain for an FET and a collector for an HBT. Additionally, with the positioning and orientation of the access holes 22, a number of individual bias lines can then be attached to a main bus.

While referring to FIG. 5, it can be seen that be seen that the base portions 21b define a pair of holes 21a. The holes 21a allow the spacers 21 to be fixed relative to each other by screws 26 that extend through the holes 21a of each spacer 21 and into the base 11. In terms of its function as a heat sink, the spacers 21 have their bridge portions 21c preferably made of low thermal resistance material such as copper. Each of the bridge portions 21c are thermally tied together, through the base portions 21b, to a main heat sink 25 which is disposed between the stacked spacers 21 and the base 11. The heat sink 25 can be fixed to the base 11 by bolts 25a, as indicated in FIG. 2.

Although the spacers 21 are equally sized and dimensioned, according to an embodiment of the present invention, it is within the scope of the present invention that the spacers 21 be of different sizes and dimensions. In particular, as described above, it may be advantageous to vary the size of the spatial areas 24. Doing so can be accomplished by varying the size of the spacers 21 and, specifically, the size of the base portions 21b. For example, with the waveguide input 12 being WR-90 and the size of the spatial areas 24 being dependent upon the number of cards 23, as described above, the spacers 21 can be accordingly sized to match the varying spatial areas 24.

After the input signal has been amplified and transitioned back to its original mode by the amplifier array 20, the amplified signal then passes into the aperture 15a which is described by the mounting flange 15. According to a preferred embodiment of the invention, the aperture 15a is sized and dimensioned like the aperture 14a. Thereafter, the amplified signal exists the fixture 10 through an aperture 13a described by the waveguide output 13. As with the waveguide input 12 and its respective mounting flange 14, the aperture 13a is configured and dimensioned to be substantially the same as that of the aperture 15a. Preferably, the waveguide output 13 is detachably fixed to the mounting flange 15 by bolts 13b, as shown in FIGS. 2 and 3.

Although the signal input and output have been described with reference to the waveguide input 12 and the waveguide output 13, respectively, it should be understood that the input 12 and the output 13 can readily serve in the other's capacity. In such situation, the input signal would be coming into the right side and being outputted from the left side of the amplifier/test fixture 10, all when viewed from FIG. 1. Of course, if the input signal is from the right side (when viewed from FIG. 1), the amplifier cards 23 must be reverse oriented to permit the input signal to the amplifier devices 38 to be directed toward the waveguide on the left side.

Furthermore, the above described embodiments of the present invention have been disclosed in the context of rectangular waveguides and a linearly stacked arrangement of cards 23. However, the scope of the present invention is not so limited. It is contemplated that the waveguides can be of other configurations, such as radial, as seen in FIG. 9. In the instance of flared coaxial waveguides, it is preferred that the cards 23" still be stacked, but in a radial arrangement within a circular-shaped mounting flange 35. The mounting flange 35 is configured to provide a circular-shaped aperture 36. In such arrangement, the cards 23" are held within the aperture 36 by a spacer 21". Further, the cards 23" are maintained in a spaced apart relationship with spatial areas 37 therebetween, like in the embodiment shown in FIG. 1. And assuming that the cards 23" are of a rectangular shape, the individual cards 23" have their planar surfaces opposite one another.

For a radial arrangement of cards 23", FIG. 10 shows another embodiment of the present invention. A spacer 21"functions like a spacer 21 to provide support and heat removal of the cards 23". But the spacer 21"is constructed in a spoke-type arrangement having a central hub portion and blade portions that extend outward from the hub portion. The cards 23"are supported at their centers and directly below the amplifier devices by the blade portions of the spacer 21', like in the case of the linearly stacked arrangement shown in FIG. 1. The cards 23" are preferably affixed to the blade portions of the spacer 21" by thermal conductive grease and screws. The spacer 21" is fabricated from a metal having a high thermal conductivity, such as copper, and the blade portions of the spacer 21" can be individually inserted or removed from the mounting flange 35 by virtue of appropriate notches in the walls of the flange 35, an inner coaxial conductor 42 and the use of slip fit thermal connections. DC bias for the individual amplifier devices on the cards 23" is brought through the sides of the mounting flange 35.

In still referring to FIG. 10, a base 11" is provided to support the various components of the fixture 10. A mounting flange 14" has a pair of adjustable flange portions 16" that can slide along a pair of slots 18" within the base 11".

The mounting flange 14" is affixed to a tapered coaxial waveguide 12" which is circular in configuration. A coaxial connector 41 receives an input signal and relays it to the coaxial waveguide 12". Within the coaxial waveguide 12" is the inner coaxial conductor 42.

After the input signal passes through the mounting flange 14", the input signal is amplified by the cards 23", only one of which is shown in FIG. 10. The cards 23" are disposed in the aperture 36 of the flange 35 which is affixed to the base 11". Upon the signal being amplified, the signal passes through a mounting flange 15" which has a pair of adjustable flange portions 17" that can slide along a pair of slots 19" in the base 11". The amplified signal then exists the fixture 10 through a waveguide output 13".

When the amplifier/test fixture 10 is being used as a testing device, as diagramatically shown in FIG. 8, then a generator 31 is of a well known design in the art which can generate an input signal 32 to the fixture 10. After amplification of the input signal 32, an output signal 34 is produced and routed to an analyzer 33 which can be of a well known design in the art. The analyzer 33 can perform testing of the output signal 34 for characteristics such as amplifier output power, gain and phase.

It should be understood, of course, that the foregoing relates to preferred embodiments of the invention and that modifications may be made without departing from the spirit and scope of the invention as set forth in the following claims.

What is claimed is:

1. A spatial-power-combined amplifier, comprising:
   a plurality of cards having amplification means for amplifying a signal;
   a plurality of spacers disposed among said cards such that said cards are spaced apart and generally disposed parallel to a direction of propagation of said signal; and
   a flange which is disposed about said cards, said flange being adjustable along said direction of propagation and relative to a base that supports said flange.

2. The apparatus of claim 1 further comprising a plurality of amplification means on each of said cards.

3. The apparatus of claim 1 further comprising a heat sink thermally engaged to said cards.

4. The apparatus of claim 1 wherein said flange directs said signal to said cards.

5. The apparatus of claim 1 wherein said spacers are configured to provide a bias access to said cards.

6. A combined spatial-power amplifier and test fixture for testing amplification devices, comprising:
   a base;
   a first mounting flange slidably engaged to said base; and
   a plurality of cards having amplification means for amplifying a signal, said cards being spaced apart from each other and releasably engaged to said first mounting flange.

7. The apparatus of claim 6, further comprising a second mounting flange such that the first and second mounting flanges are releasably engaged to opposing end portions of said cards.

8. The apparatus of claim 6, wherein said first mounting flange is contoured with a plurality of grooves for engaging said cards.

9. The apparatus of claim 6, further comprising a plurality of spacers disposed among said cards.

10. The apparatus of claim 9, wherein said spacers further comprise bias access means for allowing a biasing of said amplification means.

11. The apparatus of claim 6, further comprising a heat sink disposed adjacent to said cards.

12. A spatial-power-combined amplifier, comprising:
    a base;
    a first waveguide mounting flange engaged to said base;
    a second waveguide mounting flange engaged to said base;
    a waveguide input fixed to said first flange;
    a waveguide output fixed to said second flange;
    an amplifier array disposed between said first flange and second flange, said array comprising a plurality of semiconductors for amplifying a signal; and
    a spacer for spacing apart said semiconductors, said spacer being configured to provide a hole for allowing access for a bias connection to said semiconductors.

13. The apparatus of claim 12, wherein said base comprises at least two separable first and second components, said first component supporting said amplifier array.

14. The apparatus of claim 12, wherein said amplifier array comprises a plurality of cards which hold said semiconductors.

15. The apparatus of claim 14, further comprising a plurality of spacers.

16. The apparatus of claim 15, wherein said array comprises alternating spacers and cards.

17. The apparatus of claim 14, wherein said first and second mounting flanges are configured to provide respective apertures to engage end portions of each of said cards.

18. The apparatus of claim 14, wherein a heat sink is thermally affixed to each card.

19. The apparatus of claim 14, wherein said cards are spaced apart to provide spatial areas of the same size.

20. The apparatus of claim 14, wherein said cards are spaced apart to provide spatial areas of different sizes.

21. A test fixture for spatial-power-combined amplifier, comprising:
    a base;
    a first waveguide mounting flange slidably engaged to said base;
    a second waveguide mounting flange slidably engaged to said base;
    a waveguide input detachably fixed to said first flange;
    a waveguide output detachably fixed to said second flange; and
    an amplifier array disposed between said first flange and second flanges, said array comprising a plurality of amplifier cards that are releasably engaged to said first and second waveguide mounting flanges.

22. The apparatus of claim 21, wherein said cards are in a linearly stacked arrangement.

23. The apparatus of claim 21, wherein said cards are in a radially stacked arrangement.

24. The apparatus of claim 21, further comprising a spacer disposed among said cards.

25. The apparatus of claim 24 wherein said spacer provides a spatial area among said cards.

26. The apparatus of claim 24 wherein said spacer drains heat away from said cards.

27. The apparatus of claim 21 wherein said cards are constructed to enable an input signal to transition among multiple modes of transmission.

28. The apparatus of claim 21 wherein said array is described by M×N, with M being equal to the number of amplification devices on any one card and N being equal to the number of cards.

* * * * *